(12) United States Patent
Weyers et al.

(10) Patent No.: US 7,102,350 B2
(45) Date of Patent: Sep. 5, 2006

(54) SHIELDING APPARATUS FOR MAGNETIC RESONANCE IMAGING

(75) Inventors: Daniel J. Weyers, Brookfield, WI (US); Qin Liu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/710,278

(22) Filed: Jun. 30, 2004

(65) Prior Publication Data

US 2006/0001425 A1   Jan. 5, 2006

(51) Int. Cl.
*G01V 3/00* (2006.01)
(52) U.S. Cl. ..................................... 324/318
(58) Field of Classification Search ................ 324/318, 324/322
See application file for complete search history.

(56) References Cited

U.S. PATENT DOCUMENTS

| | | | | |
|---|---|---|---|---|
| 4,642,569 A | * | 2/1987 | Hayes et al. ................ 324/318 |
| 4,785,246 A | * | 11/1988 | Sugimoto .................... 324/318 |
| 4,871,969 A | | 10/1989 | Roemer et al. ............. 324/318 |
| 4,879,515 A | | 11/1989 | Roemer et al. ............. 324/318 |
| 5,243,286 A | | 9/1993 | Rzedzian et al. .......... 324/318 |
| 5,367,261 A | * | 11/1994 | Frederick ................... 324/318 |
| 5,381,093 A | | 1/1995 | Kawamoto .................. 324/318 |
| 5,396,173 A | | 3/1995 | Sakakura et al. .......... 324/318 |
| 5,406,204 A | * | 4/1995 | Morich et al. ............. 324/318 |
| 5,474,069 A | | 12/1995 | Wong et al. ............. 128/653.5 |
| 5,572,129 A | | 11/1996 | Carlson ...................... 324/318 |
| 5,576,622 A | | 11/1996 | Marrone et al. ............. 324/318 |
| 5,592,087 A | * | 1/1997 | Richard et al. ............. 324/318 |
| 5,642,048 A | | 6/1997 | Crozier et al. ............. 324/318 |
| 5,680,046 A | | 10/1997 | Frederick et al. .......... 324/318 |
| 5,760,584 A | | 6/1998 | Frederick ................... 324/318 |
| 5,861,838 A | | 1/1999 | El-Hamamsy et al. ...... 324/318 |
| 6,232,779 B1 | | 5/2001 | Tropp et al. ............... 324/322 |
| 6,437,567 B1 | * | 8/2002 | Schenck et al. ........... 324/318 |
| 6,498,947 B1 | | 12/2002 | Boskamp et al. .......... 600/422 |
| 6,633,161 B1 | | 10/2003 | Vaughan, Jr. ............... 324/318 |
| 2001/0035504 A1 | | 11/2001 | Hayes ..................... 250/515.1 |
| 2002/0153893 A1 | | 10/2002 | Watkins et al. ............ 324/318 |
| 2004/0113617 A1 | * | 6/2004 | de Swiet et al. ........... 324/318 |

FOREIGN PATENT DOCUMENTS

| | | |
|---|---|---|
| EP | 0 430 104 B1 | 11/1990 |
| EP | 0 856 744 B1 | 7/1992 |
| EP | 1 359 429 A2 | 11/2003 |

\* cited by examiner

*Primary Examiner*—Diego Gutierrez
*Assistant Examiner*—Jeremiah Shipman
(74) *Attorney, Agent, or Firm*—Cantor Colburn LLP

(57) ABSTRACT

An apparatus for MRI having an RF birdcage coil and an RF shield is disclosed. The RF birdcage coil includes a coil axis, an end ring portion disposed about the axis, and a plurality of legs disposed parallel to the axis and in signal communication with the end ring portion. The RF shield is disposed about the coil and is in signal communication therewith. The shield includes a cylindrical conductive sheet having first and second ends, and a plurality of sets of discontinuous slots disposed about the cylindrical sheet and running between the first and second ends, wherein a region of discontinuity within a set of the slots is aligned with the end ring portion.

17 Claims, 5 Drawing Sheets

FIG. 4
FIG. 5
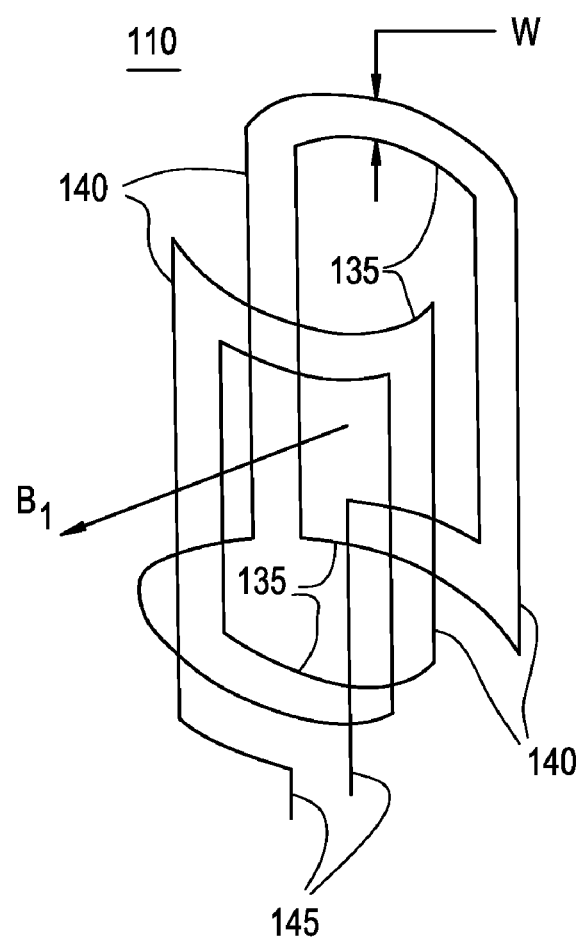
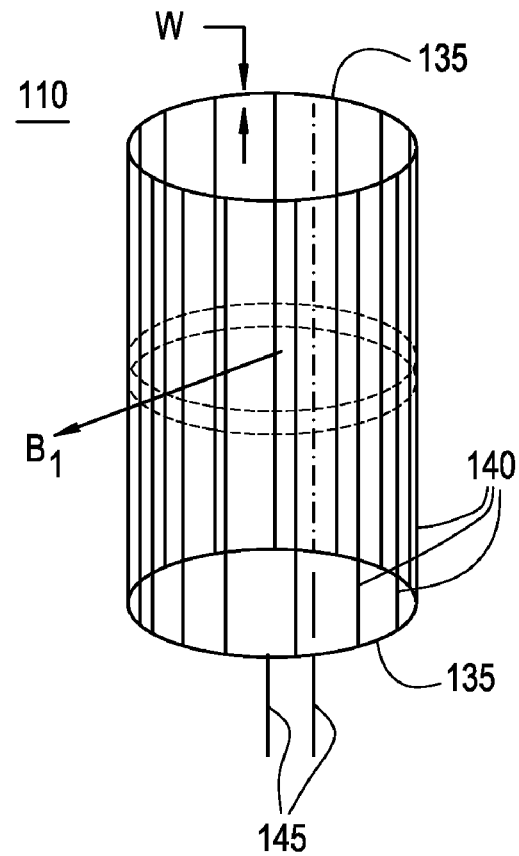

SHIELDING APPARATUS FOR MAGNETIC RESONANCE IMAGING

BACKGROUND OF THE INVENTION

The present disclosure relates generally to a shielding apparatus for magnetic resonance imaging (MRI), and particularly to a radio frequency (RF) shielding apparatus that maintains a desirable RF shielding performance of the RF fields.

In an MRI magnet, an RF shield is used to de-couple the RF coil from the gradient coil and other conducting structures. A desirable RF shield prevents the RF field generated by the RF coil, often at 10 Mega-Hertz (MHz) or higher, from penetrating into the gradient coil, while maintaining a desired quality factor (Q-factor) for the RF coil, and while remaining transparent to the field generated by the gradient coil, usually less than 100 kHz (kilo-Hertz). Available RF shields may include continuous conducting sheets or circuit board arrangements.

An RF shield made from a continuous conducting sheet may result in better shielding and a higher Q-factor with the use of thicker sheet material, but suffers from an increase in eddy currents induced by the gradient coil, thereby increasing the resistive loss and heating in the gradient coil. Reducing the sheet thickness makes the RF shield more transparent to the gradient field, by minimizing the induced eddy currents at these low frequencies, but at the expense of RF coil performance. An RF shield made from multiple segmented layers of a circuit board assembly may provide effective RF shielding by providing desired conduction paths for RF eddy currents. As a result of the segmentation and dielectric AC (alternating current) coupling between layers, the low frequency eddy currents may be minimized. However, these types of shield designs often suffer from high cost and susceptibility to damage.

Accordingly, there is a need in the art for a shielding apparatus for MRI that overcomes these drawbacks.

BRIEF DESCRIPTION OF THE INVENTION

Embodiments of the invention provide an apparatus for MRI having an RF birdcage coil and an RF shield. The RF birdcage coil includes a coil axis, an end ring portion disposed about the axis, and a plurality of legs disposed parallel to the axis and in signal communication with the end ring portion. The RF shield is disposed about the coil and is in signal communication therewith. The shield includes a cylindrical conductive sheet having first and second ends, and a plurality of sets of discontinuous slots disposed about the cylindrical sheet and running between the first and second ends, wherein a region of discontinuity within a set of the slots is aligned with the end ring portion.

Further embodiments of the invention provide an apparatus for MRI having a gradient field generating means, an RF field generating means, and a means for RF shielding the gradient field generating means. The RF field generating means has a Q-factor equal to or greater than about 50% of the Q-factor if the RF shielding means were made of a solid copper sheet having a thickness of equal to or greater than about three times the skin depth at the Larmor frequency of protons.

Yet further embodiments of the invention provide an apparatus for MRI having an RF birdcage coil and an RF shield, where the coil has a coil axis, an end ring portion disposed about the axis, and a plurality of legs disposed parallel to the axis and in signal communication with the end ring portion, and the shield is disposed about and is in signal communication with the coil. The shield includes a cylindrical copper alloy mesh sheet having first and second ends, and a plurality of sets of discontinuous slots disposed about the cylindrical sheet and running between the first and second ends, wherein a region of discontinuity within a set of the slots is aligned with the end ring portion. The shield also includes an integrally formed capacitor running lengthwise between the first and second ends, the capacitor being disposed only partially around the circumference of the cylindrical sheet.

BRIEF DESCRIPTION OF THE DRAWINGS

Referring to the exemplary drawings wherein like elements are numbered alike in the accompanying Figures:

FIGS. 4 and 5 depict exemplary RF coils for use in accordance with embodiments of the invention;

DETAILED DESCRIPTION OF THE INVENTION

Embodiments of the invention disclose an RF shield for MRI that provides an RF coil Q-factor (quality factor equal to one over loss) of equal to or greater than that of an RF shield made of a multiple layer segmented circuit board assembly. The RF shield conducts eddy currents induced by the RF coil while blocking eddy currents induced by an MRI gradient coil. As used herein, the term Q-factor refers to a dimensionless measurable quality factor of coil reactance divided by coil resistance. Alternatively, the Q-factor may also refer to the ratio of center frequency to bandwidth of an operational RF birdcage coil.

Figure 1:
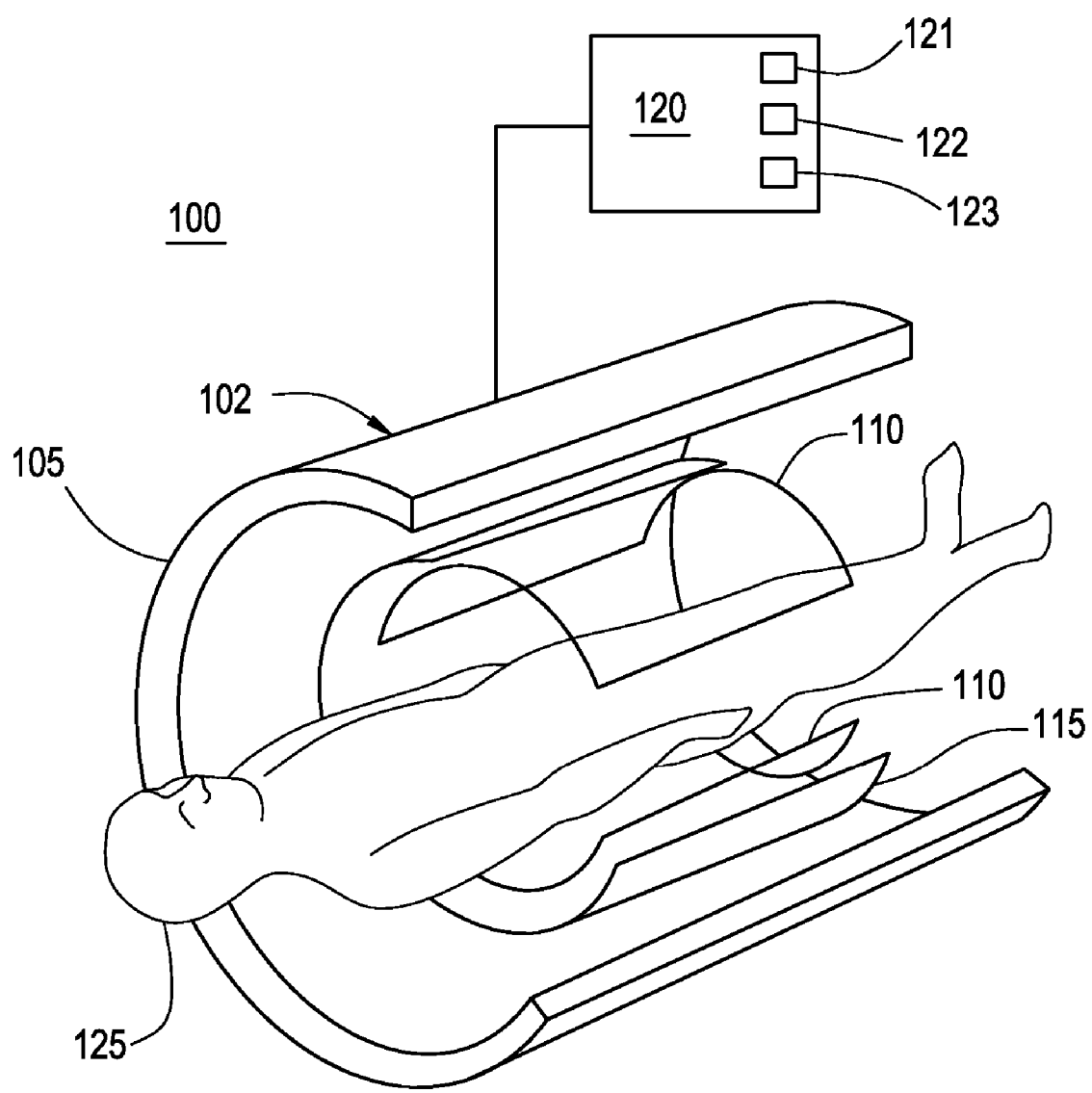
FIG. 1 depicts a partial isometric view of an exemplary MRI system for use in accordance with embodiments of the invention.

FIG. 1 depicts an exemplary embodiment of an MRI system 100 having a field-generating device 102 and a control system 120 for the control and operation thereof. Field generating device 102, shown having a portion cut-away to show further detail, includes an X, Y, Z gradient coil 105 for generating a magnetic field gradient, an RF birdcage coil (RF coil) 110 disposed within gradient coil 105 for generating a pulsed RF magnetic $B_1$ field, and an RF shield 115 disposed between RF coil 110 and gradient coil 105 for providing RF shielding to gradient coil 105. A person 125 or other imaging object is placed within field generating device 102 and subjected to MRI diagnostics under the control of control system 120. In an embodiment, control system 120 includes x, y and z-axis gradient magnetic field power supplies 121 for powering field generating device 102, transmit and receive circuitry 122 for controlling the RF pulses to RF coil 110, and a computer system 123 for controlling power supplies 121 and circuitry 122, and for processing and displaying the NMR (nuclear magnetic resonance) signals.

Figure 2:
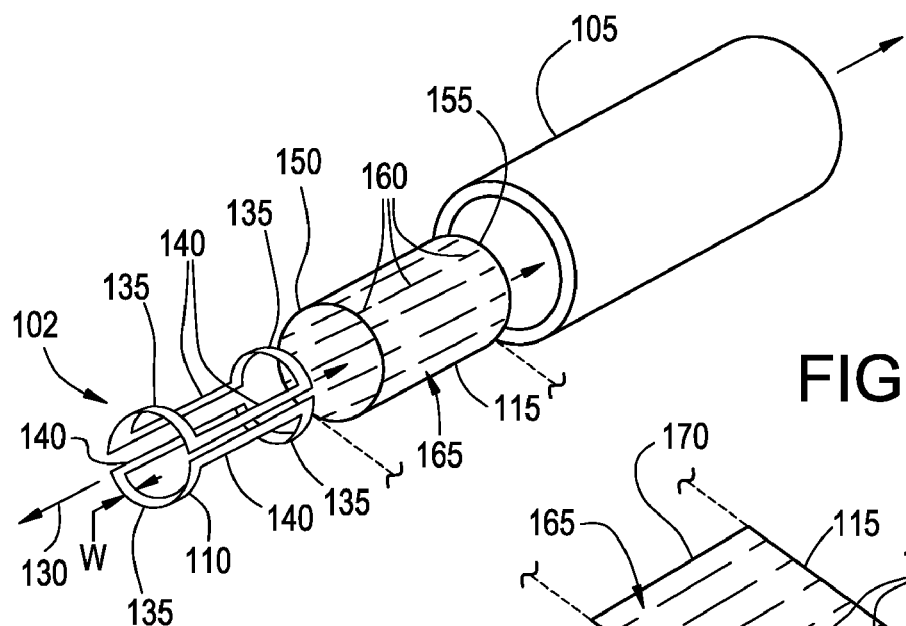
FIG. 2 depicts an exploded isometric assembly view of a portion of the system of FIG. 1.

Referring now to FIG. 2, which depicts an exploded isometric assembly view expanded along axis 130, RF coil 110 has a coil axis 130, an end ring portion 135 disposed about axis 130, a plurality of legs 140 disposed parallel to axis 130, and a pair of terminals 145 (best seen by referring to FIGS. 4 and 5) for exciting RF coil 110. RF shield 115 is cylindrically disposed about RF coil 110 in the form of a cylindrical conductive sheet having first and second ends 150, 155. In an assembled state, RF coil 110 fits within RF shield 115, which in turn fits within gradient coil 105. The conductive sheet of RF shield 115 may be a solid sheet or a mesh sheet, and may be fabricated from copper, a copper alloy such as phosphor bronze, stainless steel, or any other lowly conductive material suitable for eddy current management. As used herein, the term lowly conductive refers to materials that are about 2–20% as conductive as pure copper. In an embodiment that uses a mesh sheet, RF shield 115 may be embedded in an epoxy within gradient coil 105. Exemplary mesh densities may be equal to or greater than 100 by 100 lines per inch, and equal to or less than 400 by 400 lines per inch, with a particular embodiment having a density of 270 by 270 lines per inch with a wire diameter of about 0.0014–0.0016 inches. Within the conductive sheet is formed a plurality of sets of discontinuous slots 160 disposed about the cylindrical sheet and running between the first and second ends 150, 155. A region 165 of discontinuity within a set of the slots 160 is arranged so as to align with the end ring portion 135 when RF coil 110 is assembled within RF shield 115.

In an embodiment, region of discontinuity 165 has an axial length L equal to or greater than the width W of end ring portion 135. Axial length L is best seen by referring to FIG. 3, which depicts the cylindrical conductive sheet of RF shield 115 in an unrolled flat blank arrangement. In an alternative embodiment, region of discontinuity 165 has an axial length L equal to or greater than about 1.1 times the width W and equal to or less than about 20 times the width W. In another alternative embodiment, region of discontinuity 165 has an axial length L equal to or greater than about two times the width W. Although the number of sets of discontinuous slots 160 may be of any value, an embodiment utilizes a value that is equal to or greater than the number of legs 140 of RF coil 110.

In an embodiment, adjacent sets of slots 160 are disposed between adjacent legs 140, the plurality of sets of slots 160 are equally spaced, and slots 160 have a slot width equal to or greater than about 2 millimeters (mm) and equal to or less than about 3 mm.

Figure 3:
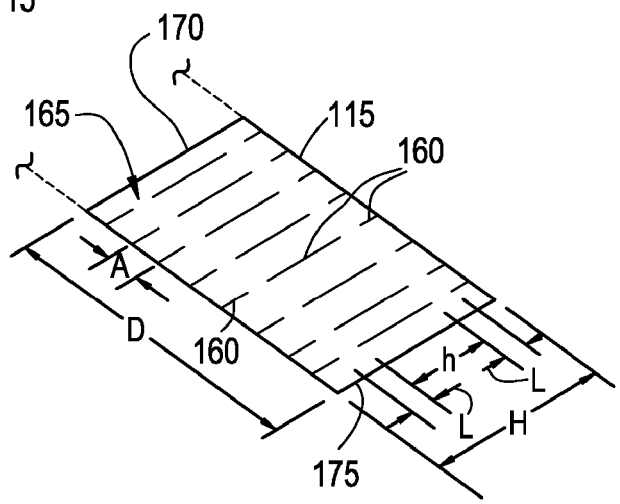
FIG. 3 depicts an isometric flat blank layout of an exemplary RF shield in accordance with embodiments of the invention.

In an exemplary RF shield 115, and with reference to FIGS. 2 and 3, suitable dimensions may include the following:

H=91–122 cm (centimeters)

L=11–21 cm h=30–50 cm

A=63–65 cm

D=205–207 cm.

In an embodiment of the invention, the Q-factor of RF coil 110 with RF shield 115 is about 260. In alternative embodiments of the invention, the Q-factor is equal to or greater than about 50% of the Q-factor when measured using a solid copper sheet for RF shield 115 where the sheet has a thickness of at least three times the skin depth at the Larmor frequency ($F_L$) of protons, which is about 63.874 MHz (Mega-Hertz). The skin depth is the depth in the direction toward the center of a conductor at which the amplitude of electromagnetic waves decays to 1/e, where e=2.718 . . . , the base of the natural logarithm.

Here, the skin depth d is given by:

$$d = 1/(\pi F_L \mu \sigma)^{0.5}, \quad \text{Equation-1}$$

where:

$\pi$ is a constant equal to the ratio of the circumference of RF shield 115 to its diameter, $\mu$ is the magnetic permeability of the conductive material of RF shield 115, and $\sigma$ is the electrical conductivity of the conductive material if RF shield 115.

Thus, with an RF shield 115 made from solid copper sheet having a thickness equal to or greater than about 3d with a resultant Q-factor of $Q_0$ at $F_L$, an embodiment of the invention results in a coil Q-factor of equal to or greater than about $0.5*Q_0$ at $F_L$.

While RF shield 115 is depicted in FIGS. 2 and 3 having a particular arrangement of discontinuous slots 160, it will be appreciated that other arrangements of discontinuous slots 160 may be employed, such that in an assembled state, as depicted in FIG. 1, the region of discontinuity 165 of RF shield 115 is aligned with a corresponding end ring portion 135 of RF coil 110.

FIGS. 4 and 5 depict alternative arrangements for RF coil 110. However, it will be appreciated that arrangements for RF coil 110 other than those depicted in FIGS. 4 and 5 may be employed in accordance with embodiments of the invention.

Figure 6:
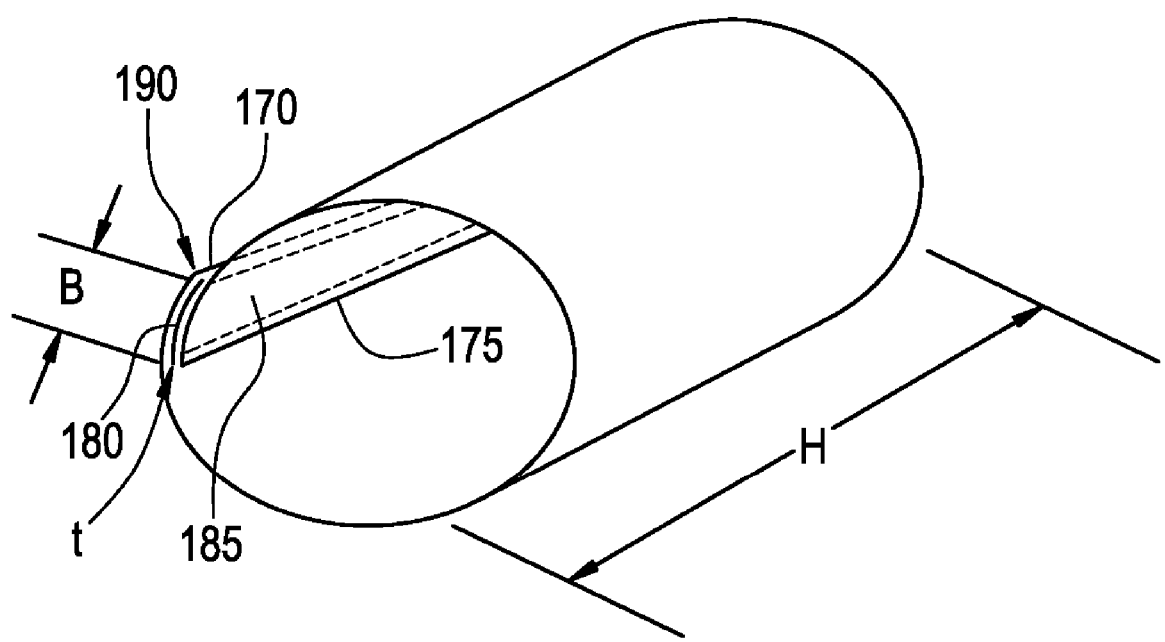
FIG. 6 depicts an alternative embodiment of the RF shield depicted in FIGS. 2 and 3.

In an alternative embodiment, referring now to FIG. 6, RF shield 115 is formed into a cylinder having overlapping edges 170, 175 with a dielectric material 180 of thickness t, width B and length H, disposed in the overlap region 185. The resulting overlap region 185 forms a capacitor 190 having a capacitance C defined by:

$$C = \in *A/t, \quad \text{Equation-2}$$

where $\in$ is the dielectric constant of dielectric material 180, A is the area of dielectric material 180 (A=B*H), and t is the thickness of dielectric material 180. In an embodiment, the capacitance C is sized high such that capacitor 190 has a low impedance X at the Larmor frequency, where X is defined by:

$$X = 1/(\varpi *C), \quad \text{Equation-3}$$

where $\varpi$ is the radian frequency (2*$\pi$*f) (f is the Larmor frequency in Hertz), and X is reactance. As can be from Equations 2 and 3, a low impedance X results from a high capacitance C, which is achieved by providing a large area A and small thickness t for dielectric material 180. In an embodiment, dielectric material 180 is a material having low loss properties, such as polyimide film for example. By providing a capacitor 190 having low impedance and low dielectric loss, the coil Q-factor of RF coil 110 with RF shield 115 will be less affected.

Figure 7:
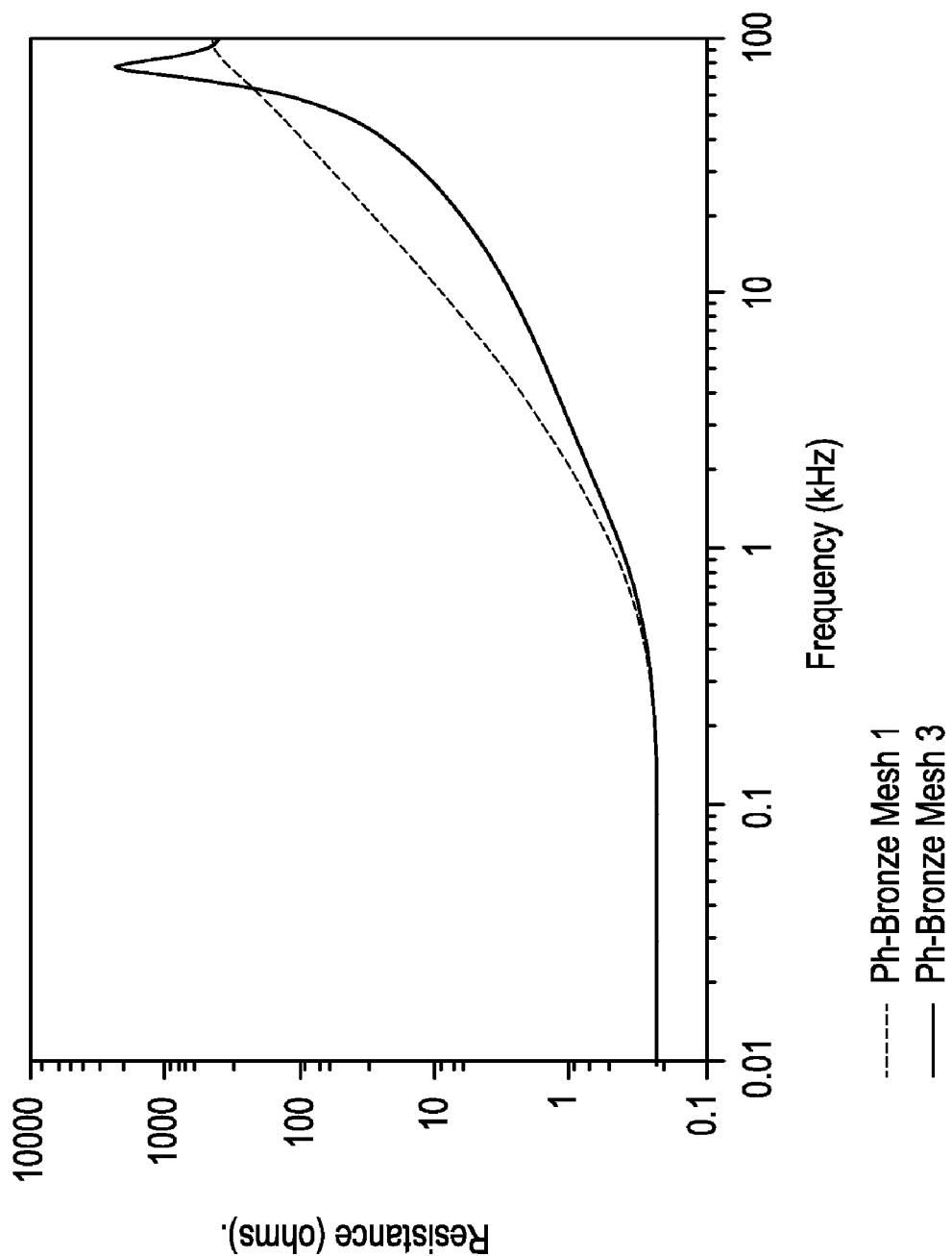
FIG. 7 depicts a set of characteristic curves illustrating an electrical characteristic in accordance with embodiments of the invention.

In an exemplary embodiment having a dielectric overlap region 185, the resistance of the Z gradient coil 105 is reduced by about three times (3×) at 10 kHz (kilo-Hertz) compared to that of the same Z gradient coil 105 with an RF shield 115 having a soldered connection between edges 170, 175. FIG. 7 illustrates a set of characteristic curves, on log-log scale, for the resistance of the Z gradient coil 105 versus frequency for two RF shields 115, identified as Ph-Bronze Mesh 1 and Ph-Bronze Mesh 3. Here, the characteristic curve for Mesh 1 is representative of a soldered arrangement and the characteristic curve for Mesh 3 is representative of a dielectric arrangement, as discussed previously, for a phosphor-bronze mesh material. As can be seen at a frequency of 10 kHz, Mesh 1 (soldered arrangement) has a resistance of about 9 Ohms, and Mesh 3 (dielectric arrangement) has a resistance of about 3 Ohms, which equates to about a 3× reduction in resistance using a dielectric arrangement. As a result, less eddy current is induced in RF shield 115, thereby reducing heating in the system.

While some embodiments of the invention include a capacitive connection at edges 170, 175 of shield 115, it will be appreciated that an electrical connection may be formed in the place of capacitor 190. However, shield 115 having an integrally formed capacitor 190 is preferred since it couples less to the Z gradient coil 105 than does an arrangement having an electrical connection and no integrally formed capacitor.

As disclosed, some embodiments of the invention may include some of the following advantages: an RF coil having a high Q-factor and low losses; an RF shield having ease of manufacturing; a mesh-type RF shield capable of being embedded in an epoxy in the gradient coil; a lower gradient resistance at 1 kHz (kilo-Hertz) and 10 kHz on both X and Y axes as compared to typical MRI field generating devices; an RF shield capable of being fabricated from a single sheet of a solid or mesh conductor; the ability to easily adjust RF and gradient performance by varying material selection, mesh configuration, material thickness, and the number and lengths of the slots; a slotted mesh RF coil having reduced gradient coupling paths with low conductivity; and, an RF shield that minimizes the low frequency eddy currents from the switching gradient magnetic fields.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. An apparatus for MRI, comprising:
   an RF birdcage coil having a coil axis, an end ring portion disposed about the axis, and a plurality of legs disposed parallel to the axis and in signal communication with the end ring portion; and
   an RF shield disposed about the coil and in signal communication therewith, the shield comprising a cylindrically arranged conductive sheet having first and second ends, a plurality of sets of discontinuous slots disposed about the cylindrical sheet and running between the first and second ends, wherein a region of discontinuity within a set of the slots aligns with the end ring portion;
   wherein the coil and shield are configured to have a desired Q-factor equal to or greater than a defined threshold Q-factor, the defined threshold Q-factor being defined as 50% of the Q-factor that the coil and shield would provide as a result of the shield being made from a sheet of solid copper having a thickness of about three times the skin depth at the Larmor frequency of protons; and
   wherein the RF shield and coil are capable of providing the desired Q-factor in response to the RF shield being configured by arranging a single sheet of the conductive sheet into the cylindrically arranged conductive sheet with a single seam running between the first and second ends.

2. The apparatus of claim 1, wherein the region of discontinuity has an axial length equal to or greater than the width of the end ring portion.

3. The apparatus of claim 2, wherein the region of discontinuity has an axial length equal to or greater than about two times the width of the end ring portion.

4. The apparatus of claim 1, wherein the number of sets of discontinuous slots is equal to or greater than the number of legs.

5. The apparatus of claim 1, wherein the sheet comprises a material having an electrical conductivity equal to or greater than about 2% and equal to or less than about 20% the electrical conductivity of pure copper.

6. The apparatus of claim 1, wherein:
   the sheet comprises a mesh; and
   in response to the seam having an overlap with a dielectric between the overlapped sections, the RF coil has a Z-gradient coil with a first resistance characteristic that is less than a second resistance characteristic that the Z-gradient coil would have as a result of the seam being electrically joined absent a dielectric overlap, the first resistance characteristic being less than the second resistance characteristic over a frequency range from 2 kHz to 50 kHz.

7. The apparatus of claim 6, wherein the mesh comprises a copper alloy.

8. The apparatus of claim 6, further comprising a gradient coil disposed about the RF coil, wherein the mesh is embedded in epoxy at the gradient coil.

9. The apparatus of claim 8, wherein the region of discontinuity has an axial length equal to or greater than about two times the width of the end ring portion.

10. The apparatus of claim 1, wherein the plurality of sets of slots are disposed between the plurality of legs.

11. The apparatus of claim 10, wherein the plurality of sets of slots are equally spaced.

12. The apparatus of claim 1, wherein:
   the RF shield further comprises an integrally formed capacitor, defined by a dielectric overlap at the single seam, running lengthwise between the first and second ends, the capacitor being disposed only partially around the circumference of the cylindrical sheet; and
   in response to the integrally formed capacitor, the RF coil has a Z-gradient coil with a first resistance characteristic that is less than a second resistance characteristic that the Z-gradient coil would have as a result of the seam being electrically joined absent a dielectric overlap, the first resistance characteristic being less than the second resistance characteristic over a frequency range from 2 kHz to 50 kHz.

13. The apparatus of claim 6, wherein:
   the first resistance characteristic is ⅓ the second resistance characteristic at 10 kHz.

14. An apparatus for MRI, comprising:
   means for generating a gradient field;

means for generating an RF field; and an RF shield disposed for shielding the gradient field generating means, the shield comprising a cylindrically arranged conductive sheet having first and second ends, and a plurality of sets of discontinuous slots disposed about the cylindrical sheet and running between the first and second ends;

wherein the RF field generating means and the RF shield are configured to have a desired Q-factor equal to or greater than a defined threshold Q-factor, the defined threshold Q-factor being defined as 50% of the Q-factor that the RF field generating means and the RF shield would provide as a result of the RF shield being made from a sheet of solid copper having a thickness of about three times the skin depth at a frequency of about 64 MegaHertz; and wherein the RF shield and the gradient field generating means are capable of providing the desired Q-factor in response to the RF shield being configured by arranging a single sheet of the conductive sheet into the cylindrically arranged conductive sheet with a single seam running lengthwise between the first and second ends.

15. The apparatus of claim 14, wherein:
the means for RF shielding comprises means for conducting eddy currents induced by the means for generating an RF field.

16. The apparatus of claim 15, wherein:
the means for RF shielding comprises means for blocking eddy currents induced by the means for generating a gradient field.

17. An apparatus for MRI, comprising:

an RF birdcage coil having a coil axis, an end ring portion disposed about the axis, and a plurality of legs disposed parallel to the axis and in signal communication with the end ring portion; and an RF shield disposed about the coil and in signal communication therewith, the shield comprising;

a single cylindrically arranged copper alloy mesh sheet having a single overlap seam, first and second ends, a plurality of sets of discontinuous slots disposed about the cylindrical sheet and running between the first and second ends, wherein a region of discontinuity within a set of the slots aligns with the end ring portion; and an integrally formed capacitor at the overlap seam running lengthwise between the first and second ends, the capacitor being disposed only partially around the circumference of the cylindrical sheet;

wherein in response to the integrally formed capacitor at the overlap seam, the RF coil has a Z-gradient coil with a first resistance characteristic that is less than a second resistance characteristic that the Z-gradient coil would have as a result of the seam being electrically joined absent a dielectric overlap, the first resistance characteristic being less than the second resistance characteristic over a frequency range from 2 kHz to 50 kHz; and wherein the first resistance characteristic is ⅓ the second characteristic at 10 kHz.

* * * * *